United States Patent
Katzenmeyer et al.

(10) Patent No.: US 11,424,135 B1
(45) Date of Patent: Aug. 23, 2022

(54) PHOTOLITHOGRAPHY OF ATOMIC LAYER RESIST

(71) Applicant: National Technology & Engineering Solutions of Sandia, LLC, Albuquerque, NM (US)

(72) Inventors: Aaron Michael Katzenmeyer, Albuquerque, NM (US); Shashank Misra, Albuquerque, NM (US); Andrew David Baczewski, Albuquerque, NM (US); Evan Michael Anderson, Albuquerque, NM (US); George T. Wang, Albuquerque, NM (US); Daniel Robert Ward, Calabasas, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/182,838

(22) Filed: Feb. 23, 2021

Related U.S. Application Data

(60) Provisional application No. 62/981,372, filed on Feb. 25, 2020.

(51) Int. Cl.
*H01L 21/428* (2006.01)
*H01L 21/3065* (2006.01)
*H01L 21/306* (2006.01)
*H01L 21/02* (2006.01)
*B82Y 40/00* (2011.01)

(52) U.S. Cl.
CPC .......... *H01L 21/428* (2013.01); *B82Y 40/00* (2013.01); *H01L 21/02532* (2013.01); *H01L 21/30604* (2013.01); *H01L 21/30655* (2013.01)

(58) Field of Classification Search
None
See application file for complete search history.

(56) References Cited

PUBLICATIONS

D.R. Ward et al. "All-optical lithography process for contacting nanometer precision donor devices", Applied Physics Letter, vol. 111, pp. 193101-1 to 193101-5. (Year: 2017).*
A. Pusel et al., "Photochemical hydrogen desorption from H-terminated silicon(111) by VUV photons", Physics Review Letter, vol. 81, pp. 645-648. (Year: 1998).*
K. Jain, "Advances in excimer laser lithography", SPIE vol. 774, pp. 115-123. (Year: 1987).*
Fuechsle, M. et al., "A Single-Atom Transistor," Nature Nanotechnology, 2012, vol. 7, pp. 242-246.
Keith, D. et al., "Single-Shot Spin Readout in Semiconductors Near the Shot-Noise Sensitivity Limit," Physical Review X, 2019, vol. 9, 041003, 11 pages.

(Continued)

*Primary Examiner* — Jiong-Ping Lu
(74) *Attorney, Agent, or Firm* — Martin I. Finston; Mark A. Dodd

(57) ABSTRACT

In a method of atomic precision advanced manufacturing (APAM), an atomic or molecular resist layer on a substrate surface is selectively depassivated by locally exciting the substrate surface with an optical beam effective to eject adsorbed atoms or molecules from the substrate surface. The substrate surface is further processed by exposing it to a precursor gas, decomposing the precursor gas to release a dopant, and incorporating the dopant into the substrate surface.

16 Claims, 5 Drawing Sheets

(56) References Cited

PUBLICATIONS

He, Y. et al., "A two-qubit gate between phosphorus donor electrons in silicon," Nature, 2019, vol. 571, pp. 371-375.

Koch, J. G. et al., "Spin read-out in atomic qubits in an all-epitaxial three-dimensional transistor," Nature Nanotechnology, 2019, vol. 14, pp. 137-140.

Ward, D. R. et al., "Atomic Precision Advanced Manufacturing for Digital Electronics," Electronic Device Failure Analysis, 2020, vol. 22, pp. 4-10.

Shen, T. C. et al., "Atomic-Scale Desorption through Electronic and Vibrational-Excitation Mechanisms," Science, 1995, vol. 268, pp. 1590-1592.

Schofield, S. R. et al., "Atomically Precise Placement of Single Dopants in Si," Physical Review Letters, 2003, vol. 91, 136104, 4 pages.

Oberbeck, L. et al., "Measurement of Phosphorus Segregation in Silicon at the Atomic Scale using Scanning Tunneling Microscopy," Applied Physics Letters, 2004, vol. 85, pp. 1359-1361.

Ward, D. R. et al., "All-optical lithography process for contacting nanometer precision donor devices," Applied Physics Letters, 2017, vol. 111, 5 pages.

Skeren, T. et al., "CMOS platform for atomic-scale device fabrication," Nanotechnology, 2018, vol. 29, 435302, 10 pages.

Yasui, K. and Kanasaki, J. "Scanning tunneling microscopic studies of laser-induced modifications of Si(001)-(2×1) surface," Journal of Applied Physics, 2011, vol. 110, 103516, 11 pages.

Ong, C. K. et al., "Heat-Flow Calculation of Pulsed Excimer Ultraviolet-Lasers Melting of Amorphous and Crystalline Silicon Surfaces," Journal of the Optical Society of America B—Optical Physics, 1986, vol. 3, pp. 812-814.

Hallman, T. Hallam, et al., "Use of a Scanning Electron Microscope to Pattern Large Areas of a Hydrogen Resist for Electrical Contacts," Journal of Applied Physics, 2007, vol. 102, 034308, 6 pages.

Liu, Z. H. et al., "Desorption of H from Si(111) by Resonant Excitation of the Si—H Vibrational Stretch Mode," Science, 2006, vol. 312, pp. 1024-1026.

Pusel, A. et al., "Photochemical Hydrogen Desorption from H-Terminated Silicon(111) by VUV Photons," Physical Review Letters, 1998, vol. 81, pp. 645-648.

Gupta, P. et al., "Hydrogen Desorption-Kinetics from Monohydride and Dihydride Species on Silicon Surfaces," Physical Review B, 1988, vol. 37, pp. 8234-8243.

Randall, J. N. et al., "Atomic Precision Patterning on Si: An Opportunity for a Digitized Process," Microelectronic Engineering, 2010, vol. 87, pp. 955-958.

Xu, J. et al., "Selective Laser Removal of the Dimer Layer from Si(100) Surfaces Revealed by Scanning Tunneling Microscopy," Physical Review B, 1996, vol. 54, pp. R4245-R4248.

Kanasaki, J. et al., "Primary Processes of Laser-Induced Selective Dimer-Layer Removal on Si(001)-(2×1)," Physical Review Letters, 2002, vol. 89, 257601, 4 pages.

Korfiatis, D. P. et al., "Conditions for Femtosecond Laser Melting of Silicon," Journal of Physics D—Applied Physics, 2007, vol. 40, pp. 6803-6808.

Jellison, G. E. Jellison, and Modine, F. A., "Optical Functions of Silicon between 1.7 and 4.7 Ev at Elevated-Temperatures," Physical Review B, 1983, vol. 27, pp. 7466-7472.

Bell, A. E., "Review and Analysis of Laser Annealing," Rca Review, 1979, vol. 40, pp. 295-338.

Wang, George T. et al., "Fair Deal GC Thrust 4: Application Platform," SAND2019-13378pe, Sandia National Laboratories, Oct. 2019, 45 pages.

Misra, Shashank et al., "Fair Deal GC Thrust 1: APAM Devices," SAND2019-13381pe, Sandia National Laboratories, Oct. 2019, 58 pages.

Katzenmeyer, A. M. et al., "Photothermal alternative to device fabrication using atomic precision advanced manufacturing techniques", Proc. SPIE 11324, Novel Patterning Technologies for Semiconductors, MEMS/NEMS and MOEMS 2020, 113240Z (Mar. 23, 2020); https://doi.org/10.1117/12.2551455, 10 pages.

Anderson, E.M. et al., "Low Thermal Budget High-k/Metal Surface Gate for buried donor-based devices," SAND2020-5994J, Sandia National Laboratories (Jun. 2020) 28 pages.

\* cited by examiner

PHOTOLITHOGRAPHY OF ATOMIC LAYER RESIST

CROSS-REFERENCE TO RELATED APPLICATION

This application claims the benefit of U.S. Provisional Application No. 62/981,372, filed Feb. 25, 2020, the entirety of which is hereby incorporated herein by reference.

ACKNOWLEDGEMENT OF GOVERNMENT SUPPORT

This invention was made with United States Government support under Contract No. DE-NA0003525 between National Technology & Engineering Solutions of Sandia, LLC and the United States Department of Energy/National Nuclear Security Administration. The United States Government has certain rights in this invention.

FIELD OF THE INVENTION

This invention relates to atomic scale manufacturing techniques for applications in the fabrication of semiconductor devices.

ART BACKGROUND

Interest in alternative semiconductor manufacturing technologies is growing with the increasing recognition that device miniaturization by conventional approaches may be approaching its limits. At the same time, there is growing interest in novel structures, such as structures doped beyond their solid solubility limits, for use in quantum computing and other emerging applications. Enhanced doping, for example, can create electrical characteristics and optical responses that are qualitatively different from those that silicon exhibits at conventional levels of doping.

One new fabrication technology that shows promise in this regard is Atomic Precision Advanced Manufacturing (APAM), also sometimes referred to as "Atomic Scale Manufacturing". In APAM, a substrate surface, typically silicon, is passivated with an atomic-layer hydrogen resist. The passivated surface is exposed to dopants in the form of a precursor gas. The incorporation of dopants occurs selectively where the resist has been removed from the surface using a scanning tunneling microscope (STM) tip. At the selected spots, precursor molecules adsorb to the silicon surface, where they are thermally decomposed and diffused into the silicon surface.

APAM processes are receiving active attention in the technical literature. The following technical articles, the entirety of each of which is hereby incorporated herein by reference, may be of interest in this regard:

M. Fuechsle, J. A. Miwa, S. Mahapatra et al., "A single-atom transistor," Nature Nanotechnology, 7(4), 242-246 (2012);

D. Keith, M. G. House, M. B. Donnelly et al., "Single-Shot Spin Readout in Semiconductors Near the Shot-Noise Sensitivity Limit," Physical Review X, 9(4), (2019);

Y. He, S. K. Gorman, D. Keith et al., "A two-qubit gate between phosphorus donor electrons in silicon," Nature, 571(7765), 371-375 (2019);

M. Koch, J. G. Keizer, P. Pakkiam et al., "Spin read-out in atomic qubits in an all-epitaxial three-dimensional transistor," Nature Nanotechnology, 14(2), 137-140 (2019);

D. R. Ward, S. W. Schmucker, E. M. Anderson et al., "Atomic Precision Advanced Manufacturing for Digital Electronics," Electronic Device Failure Analysis, 22(1), 4-11 (2020);

T. C. Shen, C. Wang, G. C. Abeln et al., "Atomic-Scale Desorption through Electronic and Vibrational-Excitation Mechanisms," Science, 268(5217), 1590-1592 (1995);

S. R. Schofield, N. J. Curson, M. Y. Simmons et al., "Atomically precise placement of single dopants in Si," Physical Review Letters, 91(13), (2003);

L. Oberbeck, N. J. Curson, T. Hallam et al., "Measurement of phosphorus segregation in silicon at the atomic scale using scanning tunneling microscopy," Applied Physics Letters, 85(8), 1359-1361 (2004);

D. R. Ward, M. T. Marshall, D. M. Campbell et al., "All-optical lithography process for contacting nanometer precision donor devices," Applied Physics Letters, 111(19), (2017); and T. Skeren, N. Pascher, A. Garnier et al., "CMOS platform for atomic-scale device fabrication," Nanotechnology, 29(43), (2018).

Currently, STM-based implementations of APAM are typically performed in ultrahigh vacuum (UHV) on a Si(100) substrate with a thin oxide layer. The following steps are typical: (a) The sample is heated to degas adsorbates; (b) the sample is bombarded with cracked hydrogen to further clean the surface; (c) the sample is heated to desorb surface oxide and reveal an atomically clean silicon surface; (d) dangling bonds on the silicon surface are passivated by hydrogen exposure; (e) the STM tip is used lithographically to selectively remove hydrogen, resulting in chemically reactive dangling bonds; (f) phosphine ($PH_3$) exposure results in selective adsorption of phosphine on patterned areas, which is followed by decomposition of the phosphine to release phosphorus (P) onto the silicon surface; (g) encapsulation by a silicon overlayer and heating leads to electrically active P substitutional impurities; and (h) electrical contacts are made to the patterned area.

A modest thermal anneals to temperatures that leave the hydrogen resist mask intact is sufficient to partially incorporate phosphorus dopants into the lattice. The subsequent encapsulation step is performed at temperatures low enough to prevent diffusion of the dopants.

For applications in manufacturing, it is noteworthy that the APAM process is thermally compatible for inclusion between the high-temperature process steps associated with front-end-of-line microelectronics manufacturing, and the low-temperature process steps associated with back-end-of-line.

In the above process, the STM can selectively depassivate hydrogen attached to the atomically clean Si(100) surface with sub-nanometer precision. (See, e.g., T.C. Shen et al. (1995), cited above.) Moreover, the STM-based APAM process can achieve active dopant concentrations exceeding the solid solubility limit in silicon. These are both important capabilities for the fabrication of advanced devices. Even without atomic precision, APAM offers important capabilities for fabricating plasmonic devices and microelectronics with enhanced doping.

As a practical matter, however, there lacks a viable path to manufacturability unless the patterning can be scaled to larger areas than those attainable with STM.

The main obstacle to achieving wafer scale is the hydrogen-depassivation lithography.

At wafer scale, the initial sample preparation and the hydrogen termination could, in principle, be implemented in a low-pressure chemical vapor deposition (LPCVD) tool, and the precursor dosing and the low-temperature silicon encapsulation could be implemented in a molecular beam epitaxy (MBE) system with a doping antechamber.

However, STM patterning is prohibitively slow for most applications, is limited to small areas (typically, 12 μm×12 μm spots), and has no known route for mass parallelization. Primarily due to the time needed for the STM to depassivate the hydrogen, it typically takes a full day just to fabricate a single device on a single chip.

Accordingly, there is a need for new extensions of the APAM approach that are scalable and that can be massively parallelized.

SUMMARY OF THE INVENTION

We have addressed this concern by replacing the STM-based patterning of the atomic-layer resist with photopatterning. Photopatterning may offer a viable route for rapid and parallel processing over large areas.

In an example implementation, we fabricated a simple APAM device using a pulsed ultraviolet laser to photothermally desorb hydrogen. We found a range of laser energy density where hydrogen could be depassivated without disrupting the structure of the surface. The depassivation was performed with pulses from a nitrogen laser, which were directed at the sample through a scanning laser microscope. The depassivated sample was then exposed to phosphine, which was decomposed and incorporated at an example temperature of 300° C. The sample was then encapsulated by a silicon overlayer, which was grown to an example thickness of 30 nm.

Accordingly, the invention in one aspect relates to a method comprising operations of passivating a semiconductor or other substrate surface with hydrogen or another atomic or molecular resist species; selectively depassivating the substrate surface; exposing the substrate surface to a precursor gas; decomposing the precursor gas to release a dopant; and incorporating the dopant into the substrate surface. In contrast to methods of the prior art, the selective depassivating according to our new approach comprises locally exciting the substrate surface with an optical beam effective to eject adsorbed resist atoms or molecules from the substrate surface.

Certain of the operations listed above may take place concurrently. For example, the optical beam may selectively depassivate the substrate surface while the substrate surface is exposed to a flow of the precursor gas. Under those conditions, the decomposition of the precursor gas to release the dopant may be partially or wholly concurrent with the local excitation by the optical beam. Likewise, the incorporation of the dopant into the substrate surface may be partially or wholly concurrent with the local excitation by the optical beam.

In example implementations, the substrate is a semiconductor, the semiconductor surface is a silicon surface, the resist is hydrogen (as silicon monohydride), the dopant is phosphorus, and the precursor gas is phosphine. However, this example should be understood as non-limiting, because we envisage that other substrate materials, other resists and other dopants and precursors may also be used. For example, other possible substrate materials include semiconductors such as germanium and silicon-germanium alloys, as well as various conductors and insulators. Other resists include chlorine, bromine and iodine. Alternatives to phosphine include arsine, boron trichloride, and diborane, which are precursor gases for doping with arsenic, boron, and boron, respectively.

The invention in a second aspect relates to an article made by the process of passivating a substrate surface with an atomic or molecular resist species, locally exciting the substrate surface with an optical beam effective to eject adsorbed resist atoms or molecules from the substrate surface such that the substrate surface becomes selectively depassivated, exposing the substrate surface to a precursor gas, and decomposing the precursor gas to release a dopant and incorporating the dopant into the substrate surface. In embodiments, the substrate surface is a silicon surface. In further embodiments, the silicon surface has a sheet carrier density greater than $2 \times 10_{14}$ cm$^{-2}$

BRIEF DESCRIPTION OF THE DRAWINGS

FIG. 4A shows a region exposed with relatively high energy laser pulses. FIG. 4B shows a region exposed with laser pulses 1 μJ lower in energy than the pulses of FIG. 4A. Subsequent to collecting these images, the exposed regions were dosed with phosphine, capped with silicon, and incorporated.

FIG. 5A is a plot of a four-point probe measurement to determine resistance. FIG. 5B is a plot of Hall resistance as a function of magnetic field, used to determine carrier density and mobility.

DETAILED DESCRIPTION

General Description. As explained above, we apply photopatterning in place of electrical stimulation from an STM tip to selectively remove hydrogen from the passivated substrate surface.

Three distinct physical methods for using light to remove hydrogen from a silicon surface have been reported in the literature. At mid-infrared wavelengths, photothermal heating by absorption at the Si-H vibrational resonance has been reported. Over the spectral range from the near-infrared to the ultraviolet, photothermal heating by absorption in the silicon substrate has been reported. At vacuum ultraviolet wavelengths, photodissociation by promoting electrons from bonding to antibonding states has been reported.

To our knowledge, however, none of these techniques has been successfully used to pattern any selective area surface chemistry aside from the formation of a native oxide, which is electrically insulating.

Figure 1:
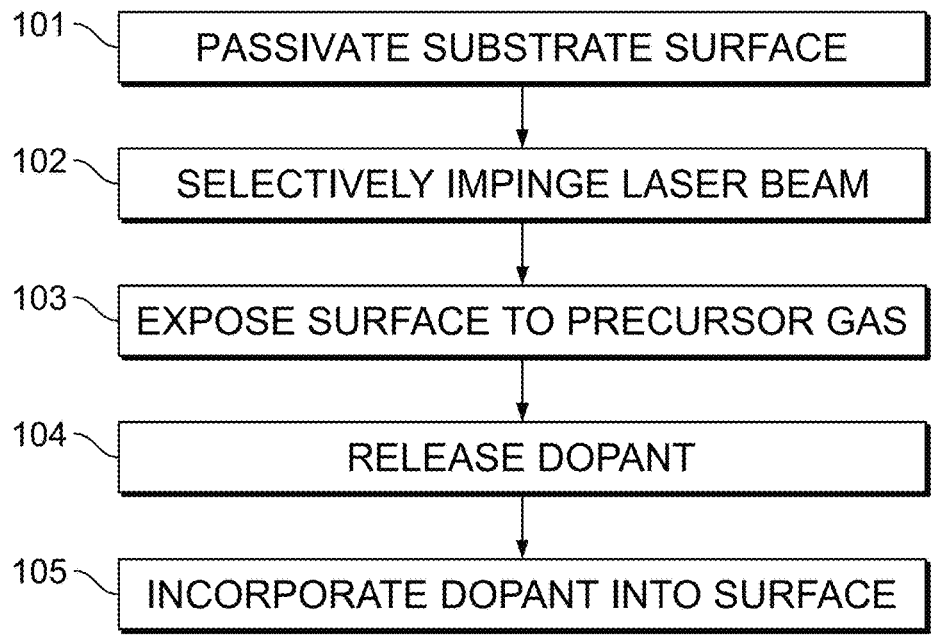
FIG. 1 is a flowchart of a method for using an optical beam to pattern a passivated silicon surface and for doping the resulting selectively depassivated surface, in a high-level overview.

By contrast, we have developed a technique for using an optical beam to pattern a passivated silicon surface and for doping the resulting selectively depassivated surface. FIG. 1 is a flowchart of our technique in a high-level overview. The operations represented in the figure are: Passivating (101) a semiconductor or other substrate surface with hydrogen or another atomic or molecular resist species; selectively impinging (102) an optical beam onto the substrate surface such that local excitation of the substrate surface causes adsorbed resist atoms or molecules to be ejected; exposing (103) the substrate surface to a precursor gas; decomposing (104) the precursor gas to release a dopant; and incorporating (105) the dopant into the substrate surface.

In example implementations, the substrate is silicon, the resist is hydrogen, and the precursor gas is phosphine, which decomposes to release phosphorus as the dopant species. The substrate surface is excited by photothermal heating in the silicon substrate. The source of the optical beam is a pulsed nitrogen laser emitting 3.5-ns pulses at a wavelength $\lambda$ of 337 nm.

Generally, optical wavelengths corresponding to photon energies greater than the bandgap of the substrate will be effective for photothermal heating. The penetration depth of the optical beam and the resultant concentration of the heating effect will depend, however, on the optical absorption coefficient of the substrate at the wavelength that is used. At very short wavelengths, moreover, photochemical reactions may compete with the heating effect.

Silicon, for example, has a bandgap of about 1.1 eV. Consequently, wavelengths less than 1130 nm will be effective for photothermal heating. At 337 nm, the heating effect is localized within about 10 nm of the silicon surface during the laser pulse. By way of illustration, a wavelength of, e.g., 532 nm may also be effective for photopatterning, but the optical penetration depth will be greater, producing a different thermal profile. In an example of a photochemical effect, light at a wavelength of about 160 nm cleave Si-H bonds without substantial heating of the substrate. Such a process may also be effective for photopatterning and is not excluded from the scope of the present invention.

In order to be able to photopattern the substrate surface with high spatial resolution, it is desirable to heat the surface rapidly with laser pulses that are short enough to produce intense local heating. In this regard, the timescale for effective pulse lengths is related to the thermal conductivity of the substrate. In silicon, we found that 3.5-ns pulses were effective. This particular pulse length was chosen for convenience, however, and is only a single example from a wide range of potentially effective pulse lengths, as those skilled in the art will recognize. Even a continuous wave (CW) laser beam could possibly be effective for photopatterning, although very high laser intensity would be needed to reach effective surface temperatures, and because the thermal spatial profile would approach equilibrium, spatial resolution would suffer.

In order for photopatterning to take place, the substrate surface must be heated above a temperature threshold for the hydrogen to desorb from the silicon surface. This threshold has been estimated as about 430° C. However, substantially higher temperatures may be needed, in practice, for photopatterning to take place. In temperature-programmed desorption (TPD) experiments, for example, hydrogen desorption has been reported at a peak surface temperature of 500° C. The dwell times for those experiments were orders of magnitude longer than our pulse lengths. That evidence suggests that the surface temperatures we are reaching with our short laser pulses are substantially greater.

Accurate characterization of the peak surface temperature is difficult, as there are practical obstacles to direct measurement. Instead, the temperature can be inferred from thermal modeling.

On the other hand, the photoheating process can be characterized by the laser fluence at a given wavelength and pulse length. In our experiments with 3.5-ns pulses at 337 nm, we found that an effective range for the laser fluence was 190-270 mJ-cm$^{-2}$. At the low end of this range, depassivation was achieved without substantial disordering of the surface. At the high end, roughening of the surface was observed.

In example embodiments, the vacuum chamber has an initial base pressure, and then the pressure rises as the precursor gas is introduced. An example base pressure is $3\times10^{-10}$ torr, followed by an increase to $1\times10^{-8}$ torr while phosphine is flowing. A typical phosphine dose is 15 Langmuirs.

In example embodiments, the substrate is heated by, e.g., a resistive heater after the precursor has been cleared from the vacuum chamber. A typical range for the heating temperature is 250° C.-350° C., although temperatures outside of this range may also be effective. A typical duration for the heating operation is 10 minutes. The purpose of the heating is to promote decomposition of the adsorbed precursor and to promote incorporation of the dopant into the substrate surface.

As pointed out above, the operations depicted in FIG. 1 include selective optical depassivation 102 and exposure 103 of the substrate surface to the precursor gas. Some embodiments take a sequential approach in which these operations are performed as separate steps, with operation 102 preceding operation 103 in sequence. Other embodiments take an approach in which these operations are performed concurrently. We refer to that approach as dope-as-you go.

The dope-as-you-go approach may be beneficial for reducing processing time. Another possible benefit is that because there is a flow of precursor gas, the need for an ultra-high vacuum is relaxed. For that reason, there is a possibility that some lithography tools unsuited for UHV processing could still be used, provided they are suited for operation with hydrogen-terminated background gases.

Figure 2:
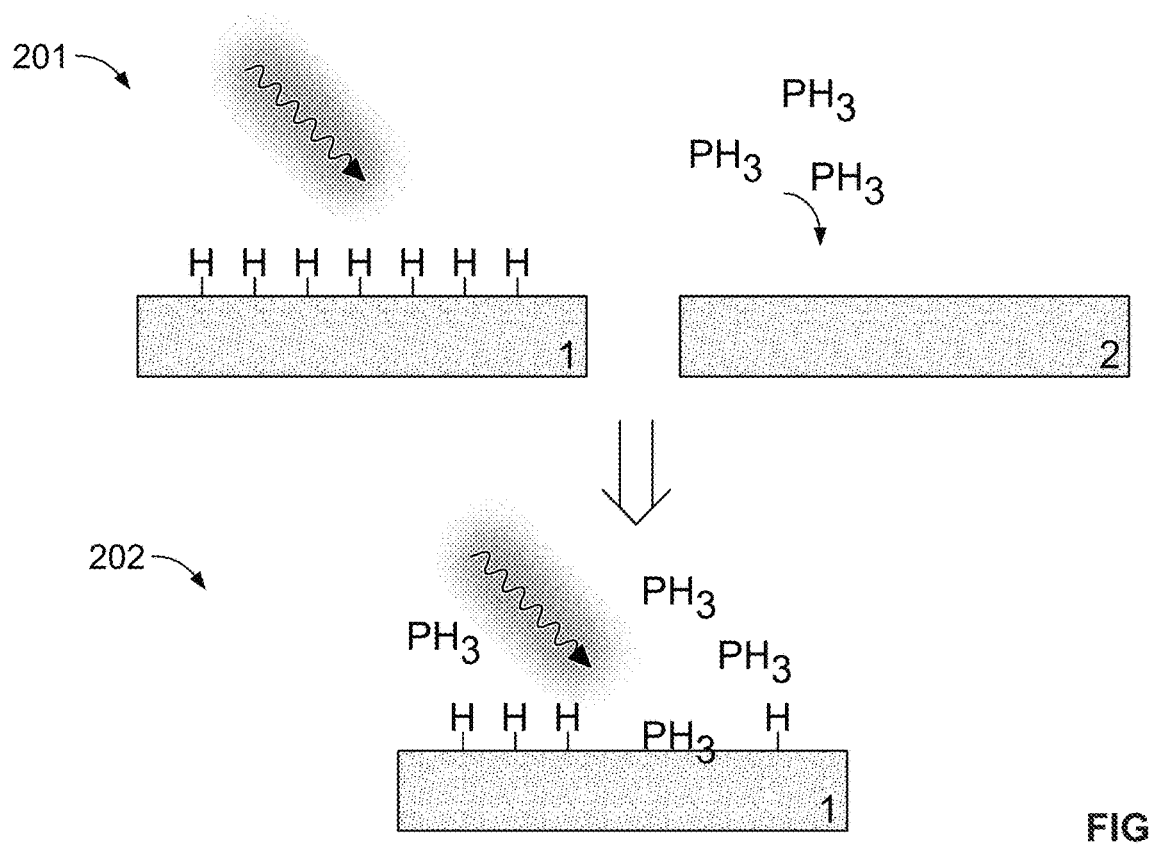
FIG. 2 is a cartoon drawing that notionally illustrates the distinction between the sequential approach and the dope-as-you-go approach to fabrication, as described herein.

FIG. 2 is a cartoon drawing that notionally illustrates the distinction between the sequential approach and the dope-as-you-go approach. In the sequential approach as depicted in the upper part 201 of the figure, the hydrogen-passivated substrate surface is first irradiated by the laser to selectively depassivate it, and then the depassivated surface is exposed to the precursor gas. In the dope-as-you-go approach as shown in the lower part 202 of the figure, the laser irradiation takes place during the time that the substrate is exposed to a flow of the precursor gas.

An example base pressure for dope-as-you-go processing is $3\times10^{-10}$ torr. In examples, the phosphine pressure ranges between $5.6\times10^{-9}$ torr and $6.3\times10^{-9}$ torr during the exposure and photopatterning. In experimental demonstrations, the laser fluence was similar to that used in the sequential approach in which operation 102 precedes operation 103. As in the sequential approach, we followed the laser exposure with a heating step to incorporate the dopant into the substrate surface.

We observed activated dopant densities in devices made by the dope-as-you-go process that were slightly higher than those made by the sequential process. Although not yet confirmed, a possible explanation is that the laser irradiation may be contributing to the dopant activation, i.e., to the precursor decomposition and/or to the incorporation of the dopant species.

Figure 3:
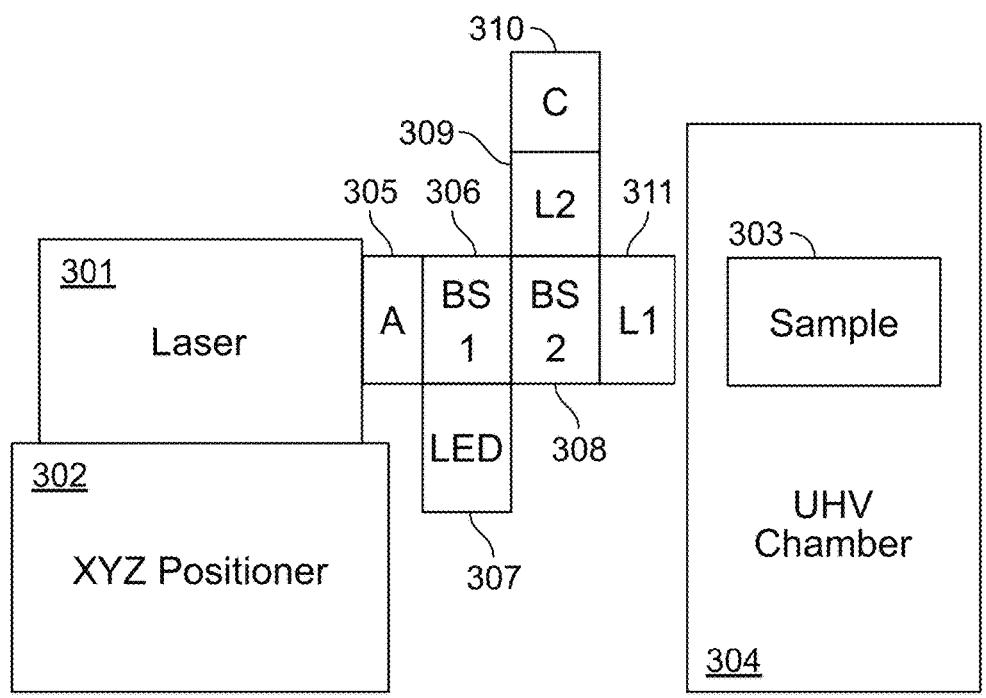
FIG. 3 is a schematic diagram of an experimental arrangement for performing certain of the studies described here. Included in the figure are an attenuator (A), a beamsplitter (BS), a camera (C), a lens (L), and a light-emitting diode (LED).

Experimental. As shown in FIG. 3, the pulsed nitrogen laser 301 was incorporated as part of a scanning optical microscope with xyz positioner 302 so that we could focus and position the laser-beam spot where desired on the surface of a substrate 303 situated within an ultrahigh vacuum (UHV) chamber 304. The microscope optical system included attenuator 305, beamsplitter 306 for coupling to LED 307, and beamsplitter 308 for coupling through lens 309 to camera 310, and lens 311 for coupling to the sample.

For sample exposure, the laser was typically driven through focus at a linear rate of 20 μm/s with a pulse repetition rate of 20 Hz. By "driven through focus" is meant that the scanning stage holding the laser and associated optics is driven so that the focal point advances from a position in front of the sample, through the sample surface, to a position behind the sample surface.

We found that hydrogen could be desorbed without damaging the substrate to an extent observable via optical or atomic force microscopy. Some restructuring of the surface at the atomic scale was observed by STM for exposures that energetically exceeded the hydrogen desorption threshold but fell below the threshold for optically detectable damage.

Figures 4A, 4B:
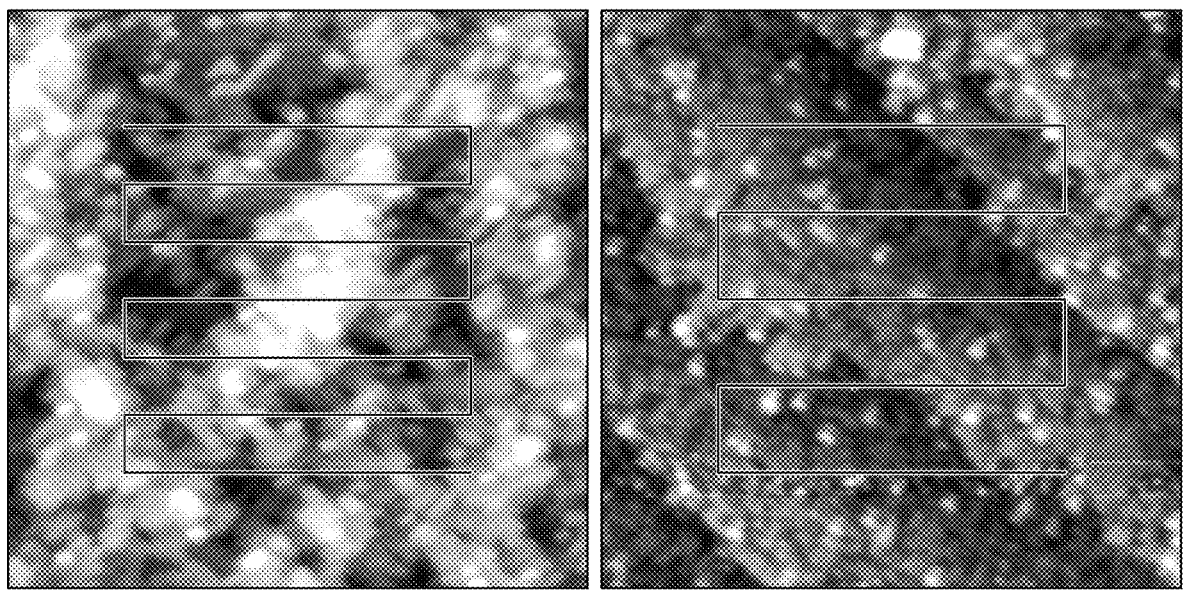
FIGS. 4A and 4B are 50 nm×50 nm STM topography scans of samples that have been treated in accordance with processes described here to remove the hydrogen resist while leaving the surface intact.

In FIG. 4A, we show an STM topography scan of a 50 nm×50 nm region that was exposed with laser pulses of relatively high energy, and in FIG. 4B we show a similar scan of a region that was exposed with pulses reduced in energy by 1 μJ relative to FIG. 4A. The laser was focused onto the sample by a reflective objective lens with a power of 15x and an NA of 0.3.

On inspection, it will be seen that a serpentine line pattern is superimposed on the two images. This pattern was applied to the sample surface by STM lithography after the laser exposure and before the STM topography scan that produced the images. The absence of any visible serpentine patterning in the topographic images (as would be evidenced by contrast between patterned and unpatterned areas) indicates that the laser exposure had successfully removed hydrogen from the sample surface prior to the attempted STM lithography. Unexposed regions (not shown in the figure) exhibited contrast after STM patterning.

It is typical in STM patterning of silicon surfaces to see terraces with atomic step edges. Although they are not seen in FIG. 4A, it is evident from FIG. 4B that reducing the laser pulse energy preserved the terraces while still depassivating the surface.

Figure 5A:
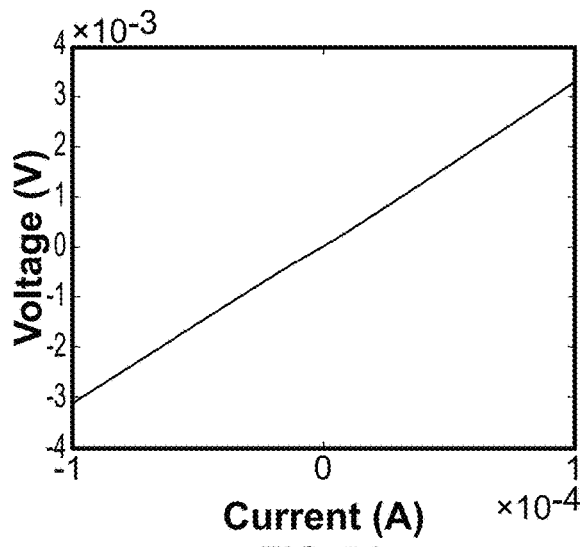
FIGS. 5A and 5B present results of the cryogenic magneto-electrical characterization of a heavily doped silicon layer device patterned by photolithography in accordance with methods described here.
Figure 5B:
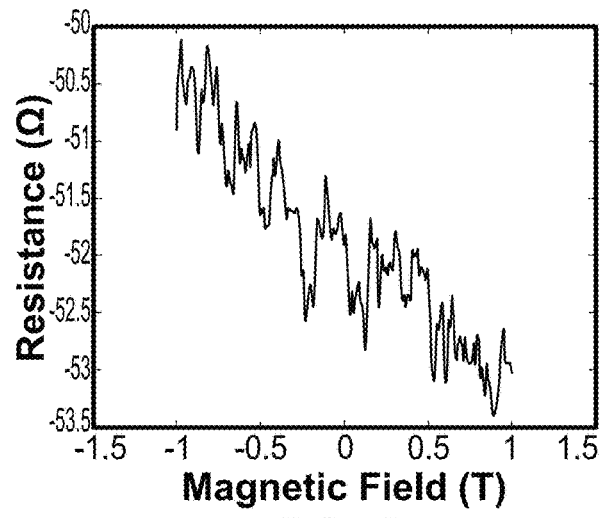

We electrically characterized a device with a surface resembling that in FIG. 4A. FIG. 5A is plot of voltage versus current, measured with a four-point probe at 4° K., to determine electrical resistance. FIG. 5B is a plot of the Hall resistance, measured at 4° K. as a function of magnetic field to determine carrier density and mobility.

At 4° K., the substrate and capping silicon do not conduct electricity at low bias, because the carriers are frozen out at low doping levels. However, an area patterned by laser and subsequently doped exhibited a resistance of less than 32 Ω in a four-point probe measurement, as seen in FIG. 5A.

The Hall measurement of FIG. 5B enables us to extract a value of $4.83\times10^{14}$ cm$^{-2}$ for the sheet carrier density. This value is approximately three times the values typically obtained using the STM procedure, which already exceeds the densities achievable by standard methods. Although we have formed no conclusions, we consider that extra surface area and/or bonding sites on the restructured surface may contribute to this high value for the sheet carrier density.

We accordingly believe that by applying our new approach, sheet carrier densities greater than $2\times10^{14}$ cm$^{-2}$ will be achievable in silicon surfaces.

The mobility that we determined for this sample was greater than 40 cm$^2$/(Vs), which appears reasonable given values obtained for STM devices and theoretical predictions for such heavily doped silicon.

Our studies showed that the concept of "dose" as understood in the context of photolithography with conventional resists does not apply to the photothermal patterning of atomic resists of the kind discussed here. For photothermal depassivation, the peak temperature of the silicon surface must exceed the temperature at which hydrogen desorbs from the substrate surface, which in examples is a silicon surface. Below this threshold, no hydrogen is desorbed. Above this threshold, notably, there is no penalty for multiple or extended exposures.

Figure 6:
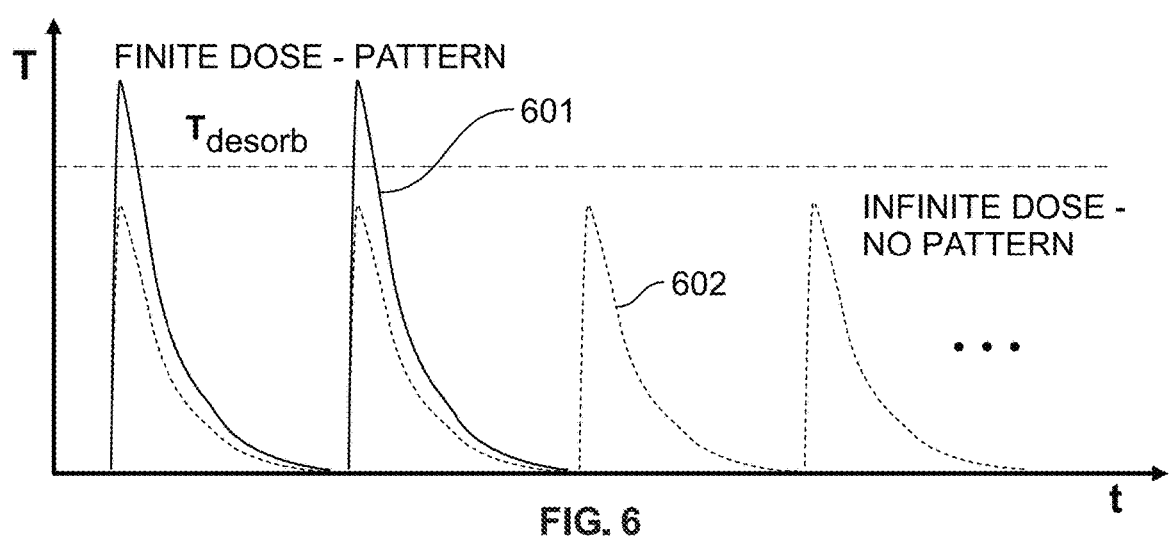
FIG. 6, which is notional only, is a composite plot of temporal temperature profiles of laser-pulse irradiation in two scenarios. In one scenario, a finite dose patterns the atomic-layer resist. In the other scenario, an infinite dose does not pattern the atomic-layer resist.

By way of illustration, FIG. 6 is a notional plot of surface temperature as a function of time for two different scenarios. Shown for one scenario is a temperature profile 601 resulting from a short laser pulse of sufficient energy density to exceed the desorption temperature, $T_{desorb}$, of the atomic-layer resist. Satisfying this condition results in depassivation.

Shown for the other scenario is a temperature profile 602 resulting from an infinite pulse train the produces a peak temperature, corresponding to each pulse, that does not exceed $T_{desorb}$. As the repetition rate is slow compared to the cooling rate of the sample, the dose cannot accumulate as it would in a conventional photoresist, and no hydrogen is desorbed.

In the first scenario, on the other hand, the pulses can have a cumulative effect, at least if they are carefully tuned. That is, even if the first pulse depassivates 99% of the hydrogen, the second pulse can remove additional hydrogen without causing any additional deleterious effects.

In practice, it is difficult to make a temperature measurement limited to the silicon surface and limited to the pulse duration (of, e.g., 3.5 ns). For our studies, we therefore tracked the energy density of the laser. We subsequently used a photothermal heating model to infer a putative temperature for the irradiated silicon surface although, as noted above, such models are challenging to interpret.

In our studies, we found that passivated and laser-exposed samples that were subsequently oxidized provided useful benchmarks for suitable laser powers and pulse patterns. To make these benchmarks, samples were removed to air after resist depassivation to selectively form native oxide on the depassivated regions. The samples were then reinserted into vacuum, annealed to 300° C. to remove physisorbed surface water, and overcoated with a 30-nm silicon cap by deposition from a sublimation source at 300° C. Differential interference contrast (DIC) imaging using a Nikon optical microscope revealed the contrast created by the buried oxide.

Figure 7:
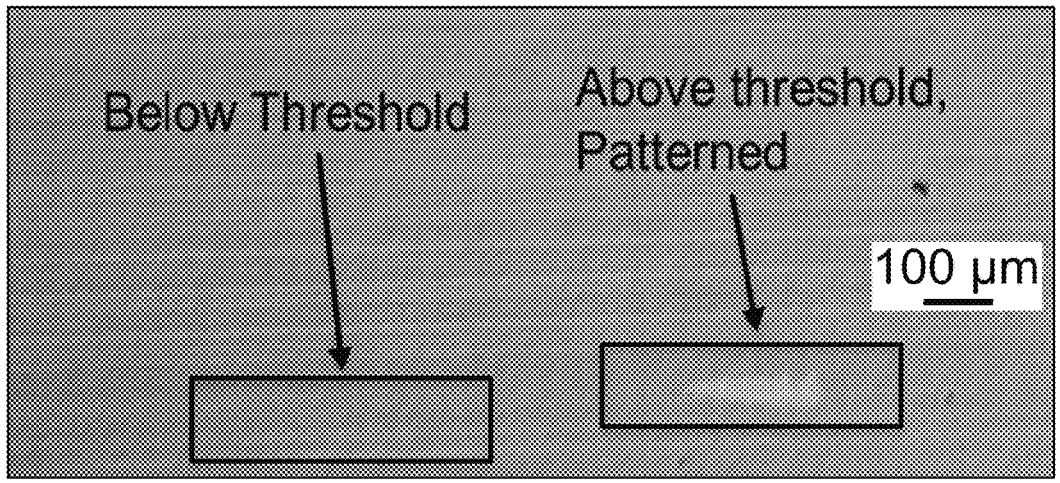
FIG. 7 is a DIC microscopy image of an exposure test sample. In the box on the right, there is shown an oxidized region resulting from above-threshold exposure and oxidation. In the box on the left, there is shown a region exposed with insufficient energy density to reach the desorption temperature.

FIG. 7 is a DIC microscopy image of an illustrative oxidized exposure-test sample. Seen on the right is an oxidized region resulting from above-threshold exposure and oxidation. Seen on the left is a region exposed with insufficient energy density to reach the desorption temperature. The presence of exposed but not desorbed resist prevented oxidation in this region.

There is a potentially wide window of surface temperatures where photothermal hydrogen desorption can be expected to be effective. The temperature must be above an estimated 430° C. to activate desorption of the monohydride termination, but it is preferably below 1400° C. to avoid melting.

However, for the purpose of making a device using the APAM process flow, this surface must also be suitable for, e.g., the phosphine chemistry. If this implies that the characteristic atomic-scale 2×1 dimer-row surface reconstruction of Si(100) must be present, then the range of acceptable laser-energy densities might be more tightly constrained. This is especially significant in view of non-thermal roughening mechanisms, which might be active during the laser pulses.

One pertinent non-thermal mechanism that has been described in the technical literature is bond scission by electronic excitation. For example, researchers have reported that at fluences of 532-nm light below 100 mJ/cm$^2$, silicon dimers only in the outermost atomic layer are desorbed from the surface. In this process, only one atomic layer is involved, and the surface retains an overall flat step terrace structure comparable to what we have shown in FIG. 4B.

Such a phenomenon has been reported, for example, in K. Yasui, and J. Kanasaki, "Scanning tunneling microscopic studies of laser-induced modifications of Si(001)–(2×1) surface,"Journal of Applied Physics, 110(10), (2011), the entirety of which is hereby incorporated herein by reference. Yasui (2010) reported that as the fluence is increased, both vacancy and addimer formation are active, leading to island and pit nucleation and roughening, similar to what we have shown in FIG. 4A.

Further discussion of surface roughening is provided in Example 1, below.

It should be noted that because the heating that leads to hydrogen desorption is due to the transient response rather than the steady state, the temperature profile at the peak of the laser pulse follows roughly the same profile as the absorbed power density. Hence, the surface temperature profile in the lateral dimensions has roughly the same shape as the incident intensity. In depth, the absorbed power density decays exponentially over a length scale set by the silicon absorption coefficient. For an ultraviolet laser in silicon, this corresponds to most of the energy being absorbed over fewer than 10 nm.

Figure 8:
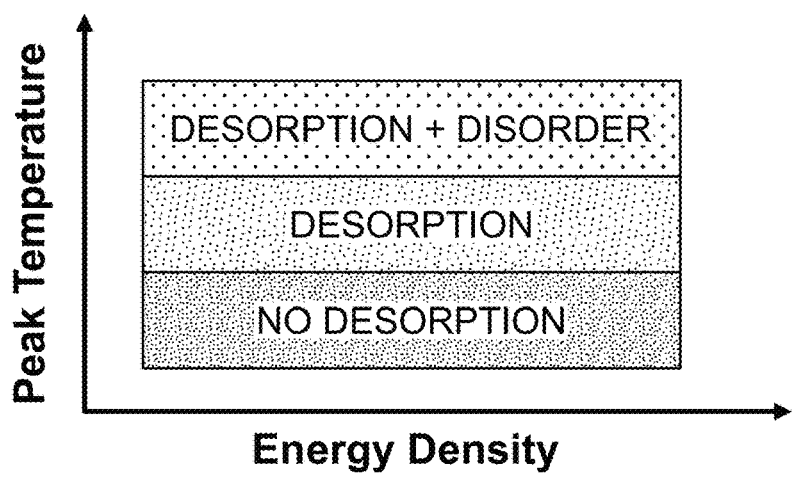
FIG. 8 is a notional map of peak silicon surface temperature versus laser fluence.

Although not wishing to be limited by mechanism, we currently believe that the surface temperature will return to ambient on a timescale on the order of picoseconds. Hence, we regard all desorption as occurring on the nanosecond timescale of the laser pulse itself FIG. 8 is a notional map of peak silicon surface temperature versus laser fluence. The figure shows a regime below a desorption threshold where no desorption takes place, a regime above a disorder threshold where both desorption and disordering occur, and an intermediate regime where desorption can take place without disordering.

Although a pulsed laser light source is used in the examples described here, other possible light sources include continuous wave lasers, lamps, LEDs, and synchrotrons.

The atomic layer resist used in the example described here is hydrogen. However, alternative resist compositions could be used without departing from the scope and spirit of the present invention. Possible alternatives to hydrogen would include any species that can form an adsorbed monolayer on a suitable substrate surface. Candidate species include chlorine, bromine, iodine, or molecules of various chemical species.

Semiconductor substrates are of particular interest, because doping that utilizes the techniques described here opens a range of new possibilities for electronic devices. Silicon is the best-studied of the semiconductor substrates in this regard, but other possibilities include germanium, silicon-germanium alloys, and III-V compositions such as GaAs, InAs, InP, and GaN. Diamond is another possible substrate material that may be useful in this regard. Still others include insulators such as alumina, silica, hafnia, and zirconia, and conductors such as aluminum, copper, silver, and gold.

Phosphorus, arsenic, and boron have been mentioned as dopants that may be delivered using the techniques described here, and phosphine, arsine, boron trichloride, and diborane have been mentioned as useful precursors for delivering those dopants. This list should not be deemed to be exclusive, because any of various additional dopants and alternative precursors are also of interest in this regard. Alternative dopants may include aluminum, gallium, and antimony. Alternative precursors may include trimethylaluminum, triethylgallium, and triphenylstibine, respectively.

Example 1

Samples were cleaned and hydrogen terminated by first flashing to 850° C. in ultra-high vacuum (1×10$^{-10}$ torr) to remove the surface oxide, followed by passivation using 2×10$_{-6}$ torr of atomic hydrogen created by a hot tungsten filament. The samples were selectively depassivated by exposure to pulsed laser light.

Laser depassivation was performed using a custom scanning laser microscope built to interface through a viewport to the UHV chamber. A nitrogen laser emitting 3.5-ns pulses of 126 µJ at 337.1 nm (bandwidth 0.1 nm) was used with variable focus and attenuation as the illumination source. The laser pulsing was triggered with a function generator to emit pulse trains with repetition rates of 100 Hz, as well as individual pulses. The beam size exiting the laser aperture was 3 mm×7 mm with a full angle divergence of 5 mrad×8 mrad. A 50-mm focal length plano-convex lens or a 13.3-mm effective focal length reflecting objective was used to focus the light onto the sample.

Figure 9A:
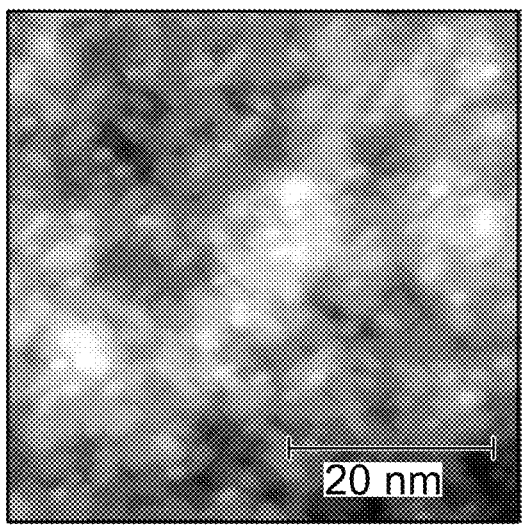
FIGS. 9A-9C are 50-nm×50-nm STM topography scans of regions of a silicon surface exposed with different laser-pulse energy densities. The respective energy densities are: 269 mJ/cm$^2$ (FIG. 9A), 241 mJ/cm$^2$ (FIG. 9B), and 194 mJ/cm$^2$ (FIG. 9C).
Figure 9B:
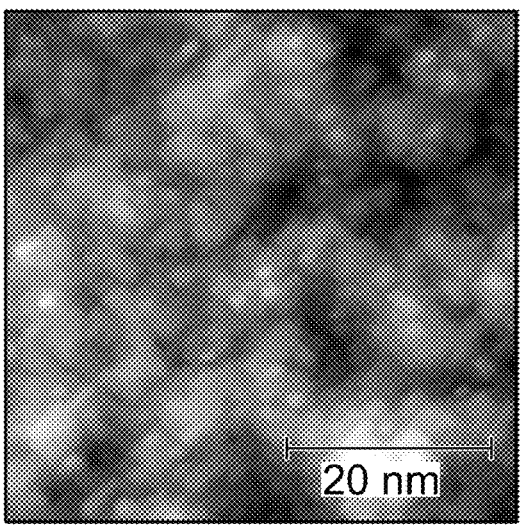
Figure 9C:
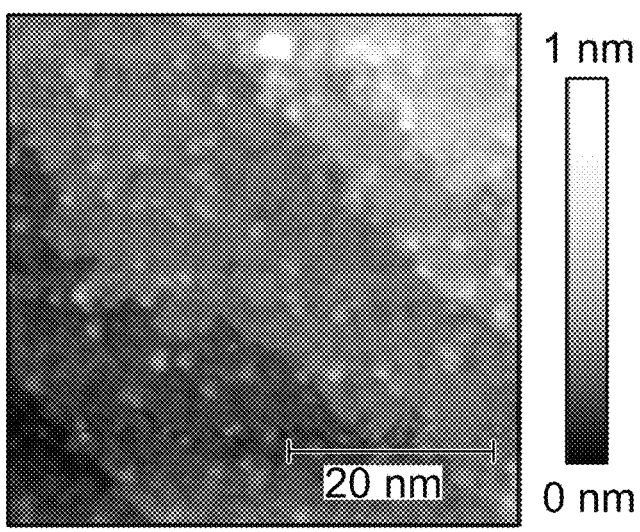

The STM images shown in FIGS. 9A-9C were taken after hydrogen depassivation using an Omicron Variable Temperature STM operating at room temperature. The images were recorded at a sample bias of −2.5 V (corresponding to electrons tunneling from the sample to the tip) and with an imaging setpoint of 0.2 nA. Each of FIGS. 9A-9C is a 50 nm×50 nm scan. The scanned region of FIG. 9A was exposed with an energy density of 269 mJ/cm$^2$, the scanned region of FIG. 9B was exposed with an energy density of 241 mJ/cm$^2$, and the scanned region of FIG. 9C was exposed with an energy density of 194 mJ/cm$^2$.

FIG. 9A is a slightly modified version of FIG. 4A, discussed above. FIG. 9C is a slightly modified version of FIG. 4B, discussed above.

As shown in FIG. 9C, the majority of the sample surface after exposure with a fluence of 194 mJ/cm$^2$ was depassivated, while the underlying flat step-terrace surface structure and the 2×1 dimer rows remained intact. As shown in FIGS. 9A and 9B, the surface roughened significantly as the laser fluence was increased to 240-270 mJ/cm$^2$.

The roughening of the surface was observed to have a layer-by-layer character, and the persistence of 2×1 dimer rows was apparent in the STM images. These are indications that the crystallinity of the surface was preserved. We note that roughening on the atomic scale, as was observed at the higher fluences, may be advantageous for ultra-doping. However, it may be unfavorable for fabricating devices with atomic precision.

Example 2

Figure 10:
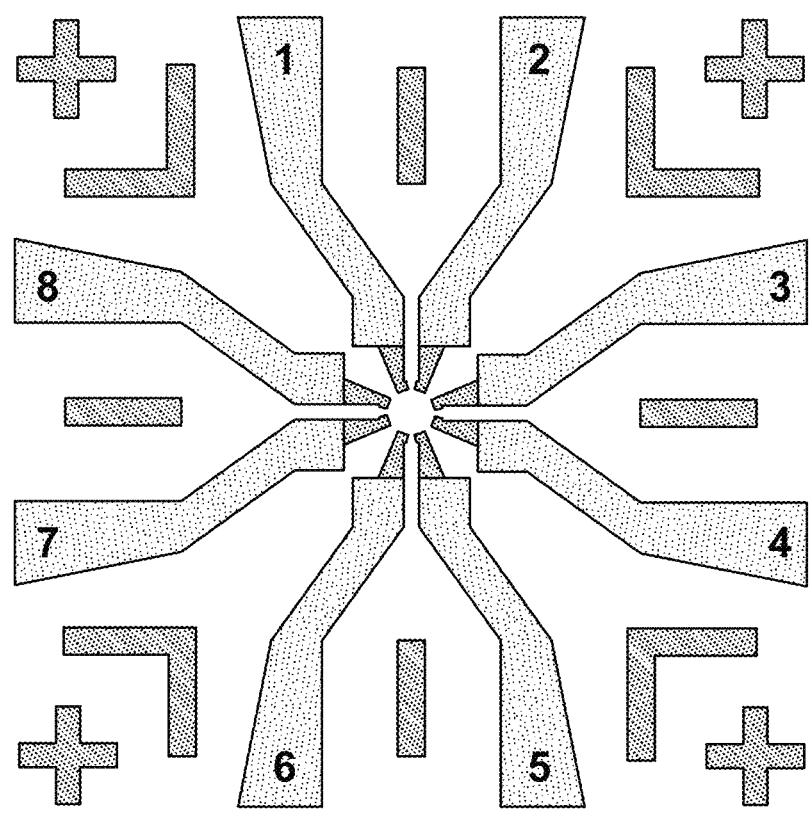
FIG. 10 is a schematic diagram, in plan view, of a photothermally patterned device made according to techniques described here and designed for making magnetotransport measurements.

FIG. 10 is a schematic diagram, in plan view, of a photothermally patterned device designed for making magnetotransport measurements by the Van der Pauw method, which is well known in the art. In the figure, the solid black crosses, corners, and bars in the periphery are tungsten alignment marks, the eight small radiating shapes at the center are ion-implanted contacts, and the elongated and bent radiating objects are aluminum leads that neck inward to the implants and fan outward to eight numbered contact pads.

The depassivated area, corresponding to the phosphorus-doped device region, was an irregular region larger than the implanted area but not extending as far as the alignment marks shown in the figure.

The respective contact pads 1, 3, 5, and 7 were used for the measurement, and the other contacts were left open-circuit.

The sample used for FIG. 10 was fabricated following the procedure found in D.R. Ward (2017), cited above, with a photothermal process replacing the STM-based hydrogen depassivation.

The procedure as described in D.R. Ward (2017) is briefly summarized here:
  (1) A p-type Si(100) wafer is prepared. Alignment marks are etched in the wafer and covered in 10 nm of sacrificial oxide. A photoresist mask is then used to perform a selective implant of arsenic ions at 40 keV and an areal density of 3×10$^{15}$ ions/cm$^2$. These ion-implanted contacts start from a 40 μm×40 μm field, large enough for aligning subsequent photolithography steps, and neck down to an 8 μm×8 μm field. Illustratively, this process creates eight ion-implanted contacts within the 40 μm×40 μm field.
  (2) The resist is then stripped, and the sacrificial oxide is removed using HF, exposing a pristine surface. After cleaning, a 10-nm steam oxide is grown at 850° C. to protect the sample, followed by a 15-minute anneal at 850° C. in nitrogen. A final photoresist mask is used to deposit tungsten alignment markers. The sample is flashed to 800° C., typically for 30 minutes, to remove surface oxide and expose the implanted silicon.
  (3) Next, hydrogen lithography is used to make direct contact to the implanted contacts, which, illustratively, neck into a square that is 8 μm on a side. The wafer surface is terminated with atomic hydrogen and selectively depassivated. Phosphine is introduced to the vacuum chamber in a total dose of 15 Langmuirs at a chamber pressure of 2×10$^{-8}$ Torr. Phosphorus dopant is thermally incorporated by heating to a nominal temperature of 250° C.-350° C. for 10 minutes, creating a phosphorus-doped nanowire that connects the arsenic-implanted regions. The wafer is then encapsulated with silicon. In examples, the encapsulating silicon is deposited at a rate of 1 nm/s to a thickness of 30 nm, while holding the sample at a temperature of 350° C.
  (4) Electrical connections to the ion-implanted contacts are made by patterning 2-μm-diameter vias with optical lithography, followed by a reactive ion etch of the silicon capping layer using CF$_4$ at 25° C. The leads are then patterned for a lift-off metal deposition.
  (5) Immediately preceding the metal deposition, a 90-second etch in 1:6 BOE (buffered oxide etch) is used to remove the remaining oxide in the vias over the ion-implanted regions. Aluminum is deposited to a depth of 150 nm by electron-beam deposition. A standard metal lift-off process then completes eight contacts that fan out into bondpads.

In the Example reported here, silicon chips with pre-implanted contacts and alignment marks were cleaned, terminated, and photothermally patterned. The sample was then dosed to 20 Langmuirs of phosphine, which was incorporated at 300° C. Then, a 30-nm layer of silicon was grown on top at the same temperature. The samples were contacted by etching vias into the implants and depositing aluminum metal.

The photothermal hydrogen depassivation was performed in the central region of the sample, where the eight pre-implanted contacts are shown in FIG. 10. The depassivation was performed with three overlapping laser pulse scans, each of energy density 100 mJ/cm$^2$.

We made magnetotransport measurements on the completed samples at a temperature of 4° K. in a maximum magnetic field of 1 T.

At 4° K., the carriers in the substrate freeze out and do not contribute to transport. DC and low-frequency transport measurements were performed in a magnetic field for extracting the density and mobility of the delta layer. The carrier density extracted from the Hall coefficient was 4.8×10$^{14}$ cm$^{-2}$. A resistivity of 250 Ω/square was obtained using the Van der Pauw method.

From the carrier density and resistivity, we extracted a mobility value of 52 cm$^2$V$^{-1}$s$^{-1}$. This mobility value is consistent with typical phosphorus delta layers produced by the conventional APAM method, while the carrier density is approximately three times as high as that of a saturated delta layer.

It should be noted in this regard that the unconventional geometry of the doped region with respect to the ion-implanted contacts can complicate a Van der Pauw measurement, shedding some doubt on the high value obtained for the carrier density. It should also be noted that surface roughness arising from the laser pulse exposure can increase the effective surface area, which can also affect the carrier density measurement.

Example 3

We fabricated van der Pauw structures by the dope-as-you-go approach. We introduced an ambient of flowing phosphine as the dopant precursor gas during the photodepassivation of the silicon monohydride. Van der Pauw measurements of a fabricated device at 4° K. indicated that the fabrication was successful. The device had a measured mobility of 52 $cm^2V^{-1}s^{-1}$ and an extremely high carrier density of $6\times10^{14}$ $cm^{-2}$.

The invention claimed is:

1. A method, comprising:
    passivating a substrate surface with an atomic or molecular resist species;
    selectively depassivating the substrate surface;
    exposing the substrate surface to a precursor gas; and
    decomposing the precursor gas to release a dopant and incorporating the dopant into the substrate surface,
    wherein the selective depassivating comprises locally exciting the substrate surface with an optical beam effective to eject adsorbed resist atoms or molecules from the substrate surface using photothermal heating.

2. The method of claim 1, wherein the exposing of the substrate surface to the precursor gas is performed after the selective depassivating of the substrate surface.

3. The method of claim 1, wherein the exposing of the substrate surface to the precursor gas is performed concurrently with the selective depassivating of the substrate surface.

4. The method of claim 1, wherein the exposing of the substrate surface to the precursor gas is performed concurrently with the selective depassivating of the substrate surface, and wherein the exposing to the precursor gas is performed by flowing precursor gas into a vacuum chamber that contains the substrate.

5. The method of claim 1, wherein the decomposing of the precursor gas and the incorporating of the dopant into the substrate surface are performed, at least in part, by heating the substrate.

6. The method of claim 1, wherein the local exciting of the substrate surface with an optical beam comprises impinging the surface of a semiconductor substrate with laser light that is optically absorbed by the semiconductor substrate.

7. The method of claim 1, wherein the local exciting of the substrate surface with an optical beam is performed by impinging at least one wavelength of light onto the substrate surface that causes photothermal heating of the substrate surface.

8. The method of claim 1, wherein the substrate surface is a silicon surface.

9. The method of claim 1, wherein the dopant is phosphorus and the precursor gas is phosphine.

10. The method of claim 1, wherein the substrate surface is a surface of a semiconductor, and the semiconductor is selected from the group consisting of silicon, germanium, and silicon-germanium alloys.

11. The method of claim 1, wherein the precursor gas is selected from the group consisting of phosphine, arsine, boron trichloride, and diborane.

12. The method of claim 1, wherein the local exciting of the substrate surface with an optical beam comprises impinging the substrate surface with laser pulses.

13. The method of claim 1, wherein the local exciting of the substrate surface with an optical beam comprises impinging the substrate surface with laser pulses, and wherein the method further comprises controlling a pulse energy of the laser pulses to lie between a predetermined threshold for depassivation and a predetermined threshold for surface damage.

14. The method of claim 1, wherein the local exciting of the substrate surface with an optical beam employs a driven through focus process.

15. The method of claim 14, wherein the driven through focus process employs a linear rate of approximately 20 µm/s.

16. The method of claim 14, wherein the driven through focus process employs a pulse repetition rate of approximately 20 Hz.

* * * * *